(12) United States Patent
Miyamoto

(10) Patent No.: US 7,474,358 B2
(45) Date of Patent: Jan. 6, 2009

(54) DIGITAL TRANSMISSION SYSTEM AND CLOCK REPRODUCING DEVICE

(75) Inventor: Masaru Miyamoto, Tokyo (JP)

(73) Assignee: Sony Corporation (JP)

( * ) Notice: Subject to any disclaimer, the term of this patent is extended or adjusted under 35 U.S.C. 154(b) by 420 days.

(21) Appl. No.: 10/910,908

(22) Filed: Aug. 4, 2004

(65) Prior Publication Data

US 2005/0058158 A1    Mar. 17, 2005

(30) Foreign Application Priority Data

Aug. 19, 2003    (JP) ............................. P2003-295257

(51) Int. Cl.
*H04N 7/08* (2006.01)
*H03L 7/06* (2006.01)
*H03D 3/24* (2006.01)

(52) U.S. Cl. ...................... 348/723; 327/156; 375/376

(58) Field of Classification Search .............. 348/723, 348/500, 537, 540, 473–477, 462–465, 516, 348/521, 512, 423.1; 455/3.2; 327/156, 327/159; 375/327, 373–376
See application file for complete search history.

(56) References Cited

U.S. PATENT DOCUMENTS

| | | | | |
|---|---|---|---|---|
| 4,374,358 A | * | 2/1983 | Hirose ..................... 324/76.58 |
| 4,780,759 A | * | 10/1988 | Matsushima et al. ........ 348/537 |
| 5,142,420 A | * | 8/1992 | Tanaka et al. ................. 360/32 |
| 5,745,314 A | * | 4/1998 | Ikeda et al. .................... 360/51 |
| 5,982,836 A | * | 11/1999 | Sakae et al. ................. 375/376 |
| 6,151,479 A | * | 11/2000 | Kummer ....................... 725/70 |
| 7,061,288 B2 | * | 6/2006 | Burgess ....................... 327/156 |
| 7,088,398 B1 | * | 8/2006 | Wolf et al. ................ 348/423.1 |
| 2006/0209969 A1 | * | 9/2006 | Miyamoto ................... 375/259 |

FOREIGN PATENT DOCUMENTS

WO    WO 02/078336 A1    10/2002

* cited by examiner

*Primary Examiner*—Paulos M Natnael
(74) *Attorney, Agent, or Firm*—Lerner, David, Littenberg, Krumholz & Mentlik, LLP

(57) ABSTRACT

Letting fp be the frequency of a pixel clock, fs be the audio sampling frequency, and fa be the frequency of an audio clock to be reproduced, $fa=384fs=(N/M)fp$, where N and M are frequency dividing ratios between the pixel clock and the audio clock of a frequency corresponding to the audio sampling frequency. When fs=48 kHz, M=27000 and N=18432, and when fs=44.1 kHz, M=30000 and N=18816. A VCO control unit detects a change in the audio sampling frequency fs from a control voltage Vctl output from a loop filter or from the frequency fo of an output clock of an oscillating unit, and then selects one of at least two VCOs.

3 Claims, 6 Drawing Sheets

$$fa = 384fs = \frac{N}{M} fp, \quad fp = 27MHz$$

|  | CASE1 | CASE2 |
|---|---|---|
| AUDIO SAMPLING FREQUENCY fs | 48kHz | 44.1kHz |
| AUDIO CLOCK FREQUENCY fa (=384fs) | 18.432MHz | 16.9344MHz |
| FREQUENCY DIVIDING RATIO M | 27000 | 30000 |
| REFERENCE SIGNAL FREQUENCY fr (=fp/M) | 1kHz | 900Hz |
| FREQUENCY DIVIDING RATIO N | 18432 | 18816 |

DIGITAL TRANSMISSION SYSTEM AND CLOCK REPRODUCING DEVICE

CROSS-REFERENCE TO RELATED APPLICATIONS

The present application claims priority from Japanese Application No. 2003-295257 filed Aug. 19, 2003, the disclosure of which is hereby incorporated by reference herein.

BACKGROUND OF THE INVENTION

The present invention relates to a digital transmission system in which audio data and content data, such as video data and the like other than the audio data, are transmitted from a transmitting side to a receiving side and then processed on the receiving side, and a device for reproducing an audio clock, which device is provided on the receiving side of the digital transmission system.

A standard referred to as a DVI (Digital Video Interface) standard has been considered as a standard for transmitting a video signal from a signal source, such as a video disk reproducing device, a video tape reproducing device, or a personal computer, as digital video data.

In this DVI standard, a video signal is transmitted as data digitized in pixel units for each of RGB (red, green, and blue) color signals through a DVI cable (a cable specified in the DVI standard). Since the video data is digitized in pixel units, it is possible to transmit high-quality images.

Since this DVI standard concerns the transmission of video data, however, when audio data is transmitted simultaneously with video data, the audio data needs to be transmitted by a transmitting means other than the DVI cable. This complicates the configuration of the transmission system.

Accordingly, WO 02/078336 (PCT/JP02/02824) proposes a method of multiplexing audio data and video data for transmission as follows.

Specifically, the method of WO 02/078336 superimposes audio data in a horizontal blanking period or a vertical blanking period of video data, and transmits the video data and the audio data. This makes it possible to transmit video data and audio data simultaneously in an existing video data transmission format such as the DVI standard and by one transmitting means such as the DVI cable.

However, while this method directly transmits a pixel clock (reference clock) for video data as a clock for data processing, it does not directly transmit a clock for audio data, that is, an audio clock, and instead transmits information representing a frequency dividing ratio between the pixel clock and the audio clock. On the receiving side, the audio clock is reproduced by a PLL (Phase Locked Loop) circuit on the basis of the information of the frequency dividing ratio and the pixel clock.

Specifically, as shown in FIG. 6, the frequency fp of the pixel clock is 27 MHz, for example. The frequency fa of the audio clock corresponds to an audio sampling frequency fs. For example, when fs=48 kHz, the frequency fa of the audio clock is 18.432 MHz, which is 384 times 48 kHz. When fs=44.1 kHz, the frequency fa of the audio clock is 16.9344 MHz, which is 384 times 44.1 kHz. The audio clock frequency fa is expressed as $$fa = 384fs = (N/M)fp \qquad (1)$$

Thus, instead of the audio clock itself or information representing the audio sampling frequency fs, information representing the frequency dividing ratios M and N is transmitted.

As shown in FIG. 6, the frequency dividing ratios M and N are M=27000 and N=18432 when the audio sampling frequency fs is 48 kHz, and the frequency dividing ratios M and N are M=30000 and N=18816 when the audio sampling frequency fs is 44.1 kHz.

On the receiving side, the audio clock is reproduced by an audio PLL as shown in FIG. 7 on the basis of the information of the frequency dividing ratios M and N and the pixel clock transmitted from the transmitting side.

Specifically, this audio PLL 60 has a VCO (Voltage Controlled Oscillator) 61. A frequency divider 71 divides the frequency fp=27 MHz of the pixel clock by M, and thereby provides a reference signal having a frequency fr=fp/M. A frequency divider 72 divides the frequency of an output clock of the VCO 61 by N. Letting fo be the frequency of the output clock of the VCO 61, the frequency divider 72 thereby provides a comparison signal having a frequency fc=fo/N. A phase comparator 73 compares phases of the reference signal and the comparison signal with each other. An error signal representing a result of the comparison is supplied to a loop filter 74. Then, an output voltage of the loop filter 74 is supplied as a control voltage Vctl to the VCO 61 to control the oscillation frequency of the VCO 61, that is, the frequency fo of the output clock.

Specifically, when M=27000 and N=18432, the frequency fc of the comparison signal from the frequency divider 72 becomes 1 kHz, which is equal to the frequency fr of the reference signal from the frequency divider 71. The VCO 61 is controlled so that the oscillation frequency fo of the VCO 61 is 18.432 MHz. Thus, an audio clock of 18.432 MHz is obtained as the output clock of the VCO 61. When M=30000 and N=18816, the frequency fc of the comparison signal from the frequency divider 72 becomes 900 Hz, which is equal to the frequency fr of the reference signal from the frequency divider 71. The VCO 61 is controlled so that the oscillation frequency fo of the VCO 61 is 16.9344 MHz. Thus, an audio clock of 16.9344 MHz is obtained as the output clock of the VCO 61. The audio PLL 60 is thus configured.

However, it is difficult to deal with the two audio clock frequencies of 18.432 MHz and 16.9344 MHz by one oscillation frequency range of one VCO 61 in the audio PLL 60 as shown in FIG. 7. In practice, it is necessary to provide a VCO having an oscillation frequency range for 18.432 MHz and a VCO having an oscillation frequency range for 16.9344 MHz, and change between the two VCOs in correspondence with the frequency of an audio clock to be reproduced.

However, in a standard referred to as an HDMI (High Definition Multimedia Interface) standard for the digital transmission system described above, information representing the audio sampling frequency fs cannot be superimposed on audio data and transmitted as information for locking the audio clock reproducing PLL on the receiving side.

It is therefore conceivable for the information representing the audio sampling frequency fs to be transmitted from the transmitting side to the receiving side by a transmitting means other than a DVI cable for transmitting video data and audio data, and for the VCO oscillation frequency range to be changed on the receiving side on the basis of the information.

This, however, requires not only the other transmitting means but also an encoder and a decoder on the transmitting side and the receiving side for the information representing the audio sampling frequency fs, thus complicating the configuration of the transmission system.

Furthermore, a temporal shift occurs due to a difference in transmission time between the information representing the audio sampling frequency fs and the pixel clock and the information of the frequency dividing ratios M and N transmitted together with the video data and audio data. A problem therefore occurs in that even when the signal source of the audio signal is changed on the transmitting side and thus the audio sampling frequency fs and the frequency dividing ratios M and N are changed, the VCO oscillation frequency range cannot be changed immediately on the receiving side. Another problem occurs when the information representing the audio sampling frequency fs does not correspond to the audio data being transmitted because of an encoding error on the transmitting side or the like and thus the audio clock corresponding to the audio data transmitted cannot be obtained.

SUMMARY OF THE INVENTION

It is accordingly an object of the present invention to make it possible to change the VCO oscillation frequency range of the audio clock reproducing PLL on the receiving side immediately and correctly in response to a change in the audio sampling frequency without transmitting information representing the audio sampling frequency as information for locking the audio clock reproducing PLL on the receiving side from the transmitting side to the receiving side, and thus reliably reproduce the audio clock of the frequency corresponding to the audio sampling frequency.

The present invention makes the foregoing object possible. According to the present invention, there is provided a digital transmission system including a transmitting side operable to multiplex audio data and content data other than the audio data, to add a reference clock for the content data and other information to the multiplexed data to form composite data, the other information representing a frequency dividing ratio between the reference clock and an audio clock of a frequency corresponding to an audio sampling frequency, and to transmit the composite data, and a receiving side operable to receive the composite data, to process the content data based on the reference clock, to reproduce the audio clock from the reference clock and the other information using a phase locked loop (PLL) circuit, and to process the audio data based on the reproduced audio clock; wherein the phase locked loop circuit includes a control unit and a voltage controlled oscillator (VCO), the control unit being operable to detect a change in the audio sampling frequency from a signal obtained within the phase locked loop circuit, and to change an oscillation frequency range of the voltage controlled oscillator when a change in the audio sampling frequency is detected.

DETAILED DESCRIPTION

Figure 1:
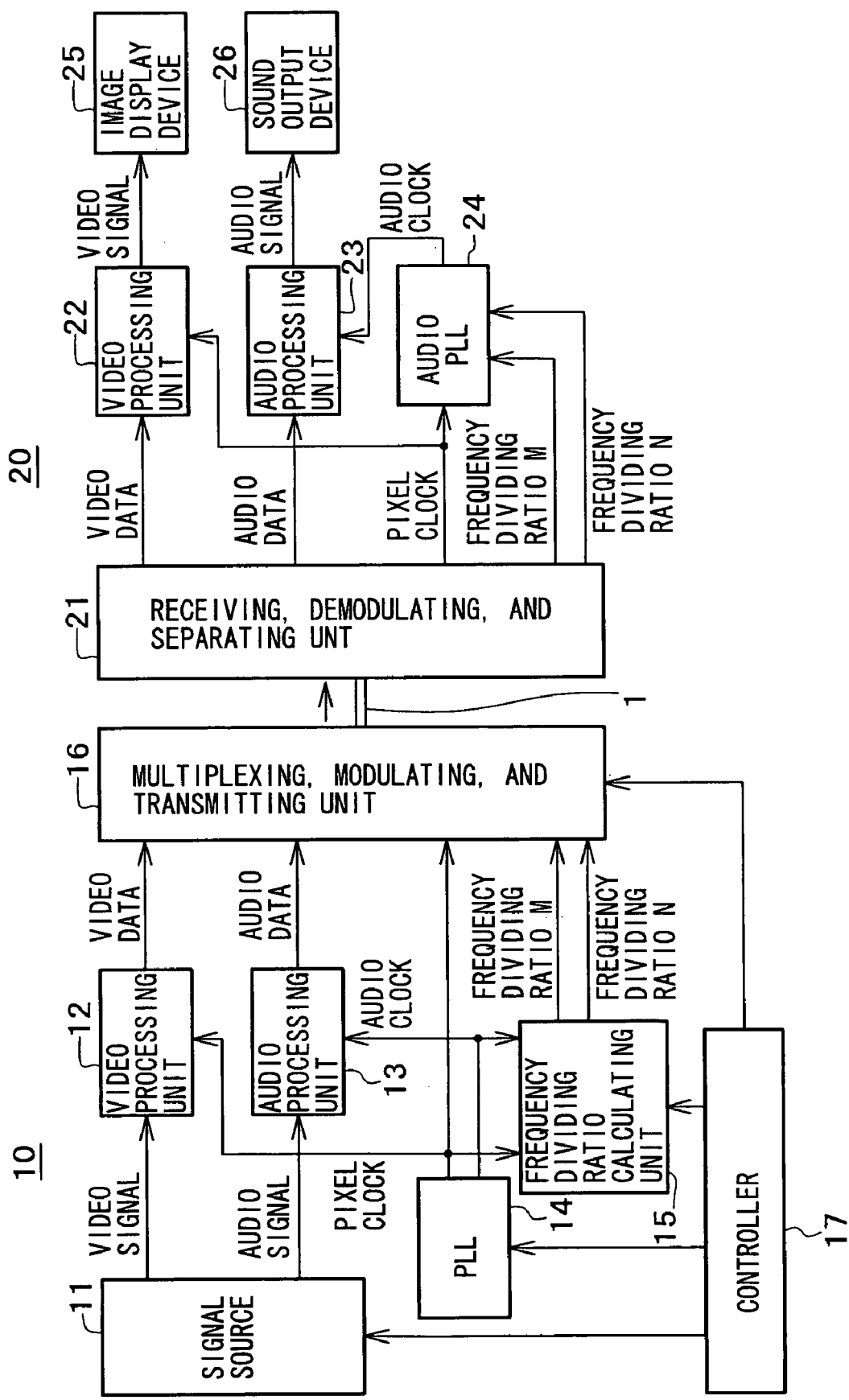
FIG. 1 is a diagram showing an embodiment of a digital transmission system according to the present invention.

Embodiment of Digital Transmission System: FIG. 1

FIG. 1 shows an embodiment of a digital transmission system according to the present invention.

In the digital transmission system according to the present embodiment, a video signal and an audio signal are obtained from a signal source 11 of a transmitting side 10. The signal source 11 is, for example, a TV (television) tuner, a personal computer, or a device for reproducing a video signal and an audio signal from a recording medium, such as an optical disk, a magnetic tape or the like. There may be the same signal source 11 or separate signal sources 11 for the video signal and the audio signal.

The video signal obtained from the signal source 11 is processed by a video processing unit 12 on the basis of a pixel clock from a PLL 14, whereby video data after the processing is obtained from the video processing unit 12. The pixel clock frequency fp is 27 MHz, for example. The video data after the processing is digitized in pixel units for each of RGB (red, green, and blue) color signals, for example.

The audio signal obtained from the signal source 11 is processed by an audio processing unit 13 on the basis of an audio clock from the PLL 14, whereby audio data after the processing is obtained from the audio processing unit 13. An audio sampling frequency fs is 48 kHz or 44.1 kHz, for example. An audio clock frequency fa is, for example, 18.432 MHz or 16.9344 MHz, which is 384 times the audio sampling frequency fs. The audio data after the processing is digitized in a predetermined format.

A frequency dividing ratio calculating unit 15 calculates frequency dividing ratios M and N from the pixel clock frequency fp and the audio clock frequency fa or the audio sampling frequency fs. Specifically, the frequency dividing ratio calculating unit 15 can be configured to have a table describing correspondences between the pixel clock frequency fp and the audio clock frequency fa or the audio sampling frequency fs and the frequency dividing ratios M and N, and to read the frequency dividing ratios M and N from the table.

Then, a multiplexing, modulating, and transmitting unit 16 multiplexes the video data from the video processing unit 12, the audio data from the audio processing unit 13, the pixel clock from the PLL 14, and information of the frequency dividing ratios M and N from the frequency dividing ratio calculating unit 15. The multiplexing, modulating, and transmitting unit 16 modulates the result for transmission. The multiplexing, modulating, and transmitting unit 16 transmits the result to a receiving side 20 through a cable 1, such as a DVI cable or the like. Specifically, the audio data is superimposed in a horizontal blanking period or a vertical blanking period of the video data.

Incidentally, the signal source 11, the video processing unit 12, the audio processing unit 13, the PLL 14, the frequency dividing ratio calculating unit 15, and the multiplexing, modulating, and transmitting unit 16 are controlled by a controller 17.

A receiving, demodulating, and separating unit 21 on the receiving side 20 receives and demodulates the signal transmitted from the transmitting side 10 through the cable 1, and separates the signal into video data, audio data, a pixel clock, and information of frequency dividing ratios M and N.

The separated video data is processed by a video processing unit 22 on the basis of the separated pixel clock, whereby a video signal after the processing is obtained from the video processing unit 22. The video signal is supplied to an image display device 25, so that an image is displayed on a screen of the image display device 25.

Meanwhile, an audio PLL 24 reproduces an audio clock from the separated pixel clock and the separated information of the frequency dividing ratios M and N, as later described. The separated audio data is processed by an audio processing unit 23 on the basis of the audio clock reproduced by the audio PLL 24, whereby an audio signal after the processing is obtained from the audio processing unit 23. The audio signal is supplied to a sound output device 26, so that sound (audio) is output from the sound output device 26.

Embodiment of Audio PLL: FIGS. 2 to 5

FIRST EXAMPLE

FIG. 2 and FIG. 3

Figure 2:
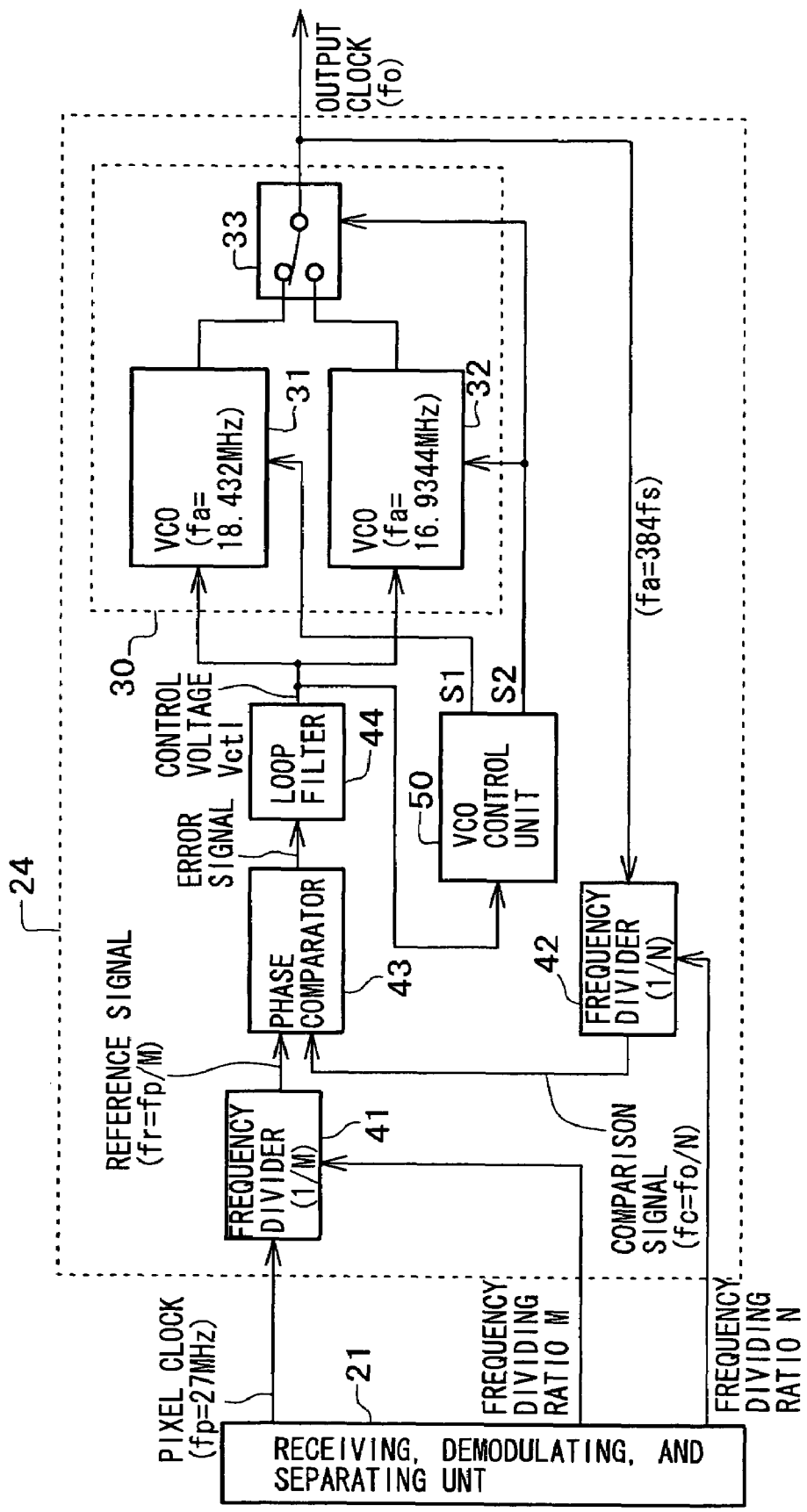
FIG. 2 is a diagram showing an example of an audio PLL on a receiving side.

FIG. 2 shows a first example of the audio PLL 24.

The audio PLL 24 in this example includes a switching selector circuit 33 and two VCOs 31 and 32 as an oscillating unit 30 so as to deal with the audio sampling frequency fs switched to 48 kHz and 44.1 kHz on the transmitting side 10 as described above.

The VCO 31 provides an audio clock of a frequency fa=384 fs of 18.432 MHz. The VCO 32 provides an audio clock of a frequency fa=384 fs of 16.9344 MHz. Each of the VCOs 31 and 32 has a narrow oscillation frequency range so as to ensure a certain jitter performance, and has a characteristic of linearly increasing the oscillation frequency as an input control voltage Vctl is increased.

The audio PLL 24 comprises such an oscillating unit 30, frequency dividers 41 and 42, a phase comparator 43, a loop filter 44, and a VCO control unit 50.

The frequency divider 41 divides the frequency fp=27 MHz of the pixel clock by M, and thereby provides a reference signal having a frequency fr=fp/M. The frequency divider 42 divides the frequency of an output clock of the oscillating unit 30 by N. Letting fo be the frequency of the output clock of the oscillating unit 30, the frequency divider 42 thereby provides a comparison signal having a frequency fc=fo/N.

The phase comparator 43 compares the phase of the reference signal from the frequency divider 41 with the phase of the comparison signal from the frequency divider 42. An error signal representing a result of the comparison is smoothed by the loop filter 44. Then, an output voltage of the loop filter 44 is supplied as a control voltage Vctl to the VCOs 31 and 32 to control the oscillation frequency of the VCOs 31 and 32.

The VCO control unit 50 in this example detects a change in the audio sampling frequency fs from the control voltage Vctl as the output of the loop filter 44, that is, the error signal as the output of the phase comparator 43, and changes the oscillation frequency range of the oscillating unit 30, that is, selects one of the VCO 31 and the VCO 32.

Figure 3:
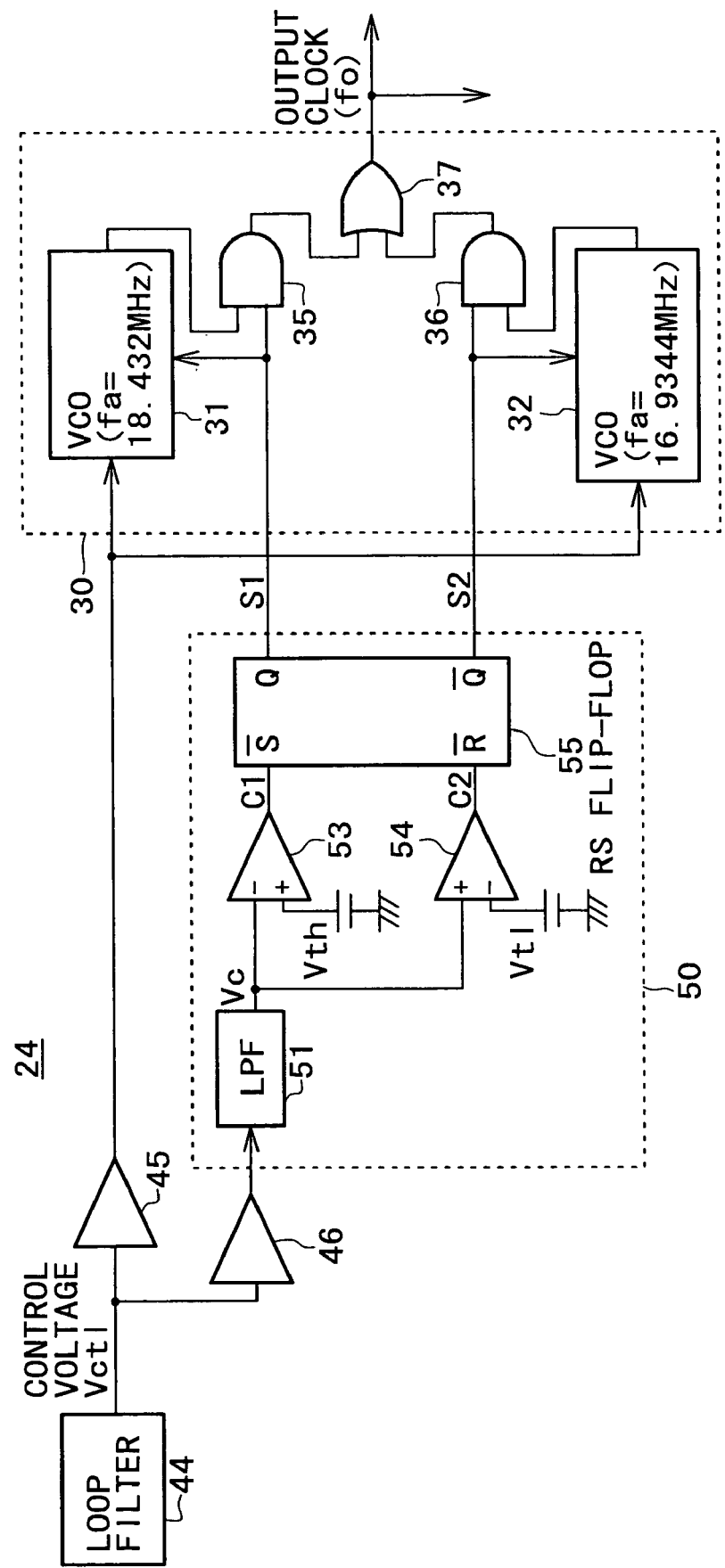
FIG. 3 is a diagram showing a concrete example of a VCO control unit in the audio PLL of FIG. 2.

FIG. 3 shows a concrete example of the VCO control unit 50. In this example, the control voltage Vctl as the output of the loop filter 44 is supplied to the VCOs 31 and 32 via a buffer 45 on one hand, and supplied to the VCO control unit 50 via a buffer 46 on the other hand.

The VCO control unit 50 comprises a low-pass filter 51, two comparators 53 and 54, and a state retaining RS flip-flop 55.

The low-pass filter 51 is to provide a certain time constant to the control voltage Vctl. The comparators 53 and 54 compare an output voltage Vc of the low-pass filter 51 with a threshold voltage Vth on a high-voltage side and a threshold voltage Vtl on a low-voltage side, respectively. Output signals C1 and C2 of the comparators 53 and 54 are supplied to a set side and a reset side, respectively, of the RS flip-flop 55.

The RS flip-flop 55 supplies one output signal S1 as a control signal to the VCO 31 and another output signal S2 as a control signal to the VCO 32.

The switching selector circuit 33 shown in FIG. 2 is specifically configured such that, in the example of FIG. 3, an output clock of the VCO 31 and the control signal S1 are supplied to an AND gate 35, an output clock of the VCO 32 and the control signal S2 are supplied to an AND gate 36, output signals of the AND gates 35 and 36 are supplied to an OR gate 37, and an output signal of the OR gate 37 is extracted as an output clock of the oscillating unit 30.

In the above example, when fs=48 kHz, M=27000, and N=18432 as shown in Case 1 in FIG. 6, detection and control of the VCO control unit 50 as described later makes the control signal S1 active (high level) and the control signal S2 inactive (low level), and thereby makes the VCO 31 active and the VCO 32 inactive.

Thus, at this time, the output clock of the VCO 31 is extracted as the output clock of the oscillating unit 30. Also, the frequency fc of the comparison signal from the frequency divider 42 becomes 1 kHz, which is equal to the frequency fr of the reference signal from the frequency divider 41. The VCO 31 is controlled so that the oscillation frequency of the VCO 31 becomes 18.432 MHz. Thus, an audio clock of 18.432 MHz is obtained as the output clock of the oscillating unit 30.

Figures 5, 6:
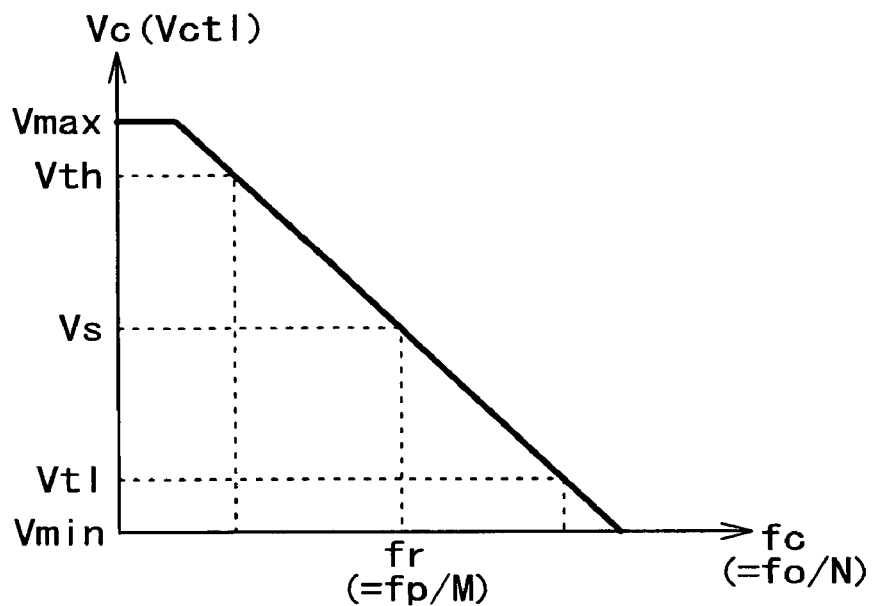
FIG. 5 is a diagram showing the characteristics of a control voltage with respect to the frequency of a comparison signal.
FIG. 6 is a diagram showing examples of audio sampling frequency, audio clock frequency, and frequency dividing ratio.
Figure 7:
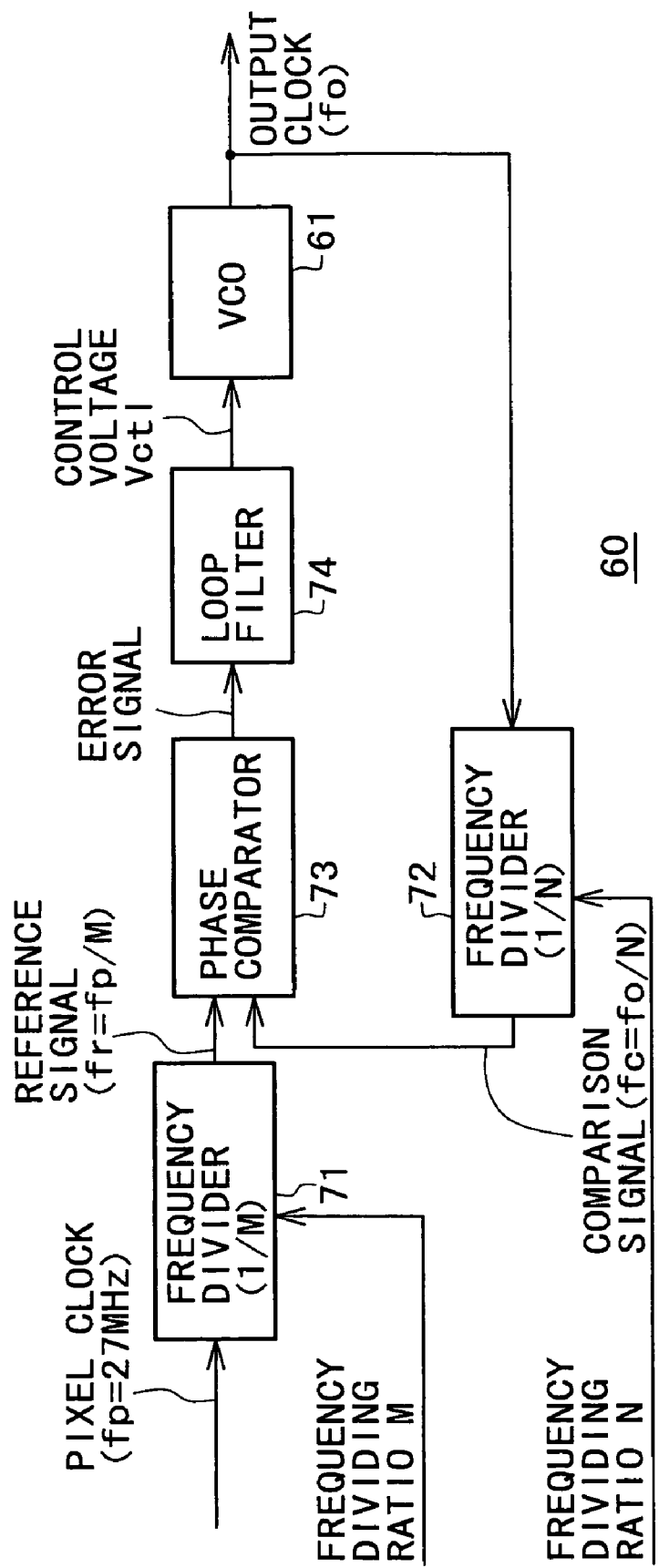
FIG. 7 is a diagram showing a conventional audio PLL.

At this time, the output voltage Vc of the low-pass filter 51 of the VCO control unit 50 in the audio PLL 24, that is, the control voltage Vctl as the output of the loop filter 44, is in a state of being locked and stabilized around a voltage Vs in FIG. 5. FIG. 5 shows characteristics of the output voltage Vc (control voltage Vctl) with respect to the frequency fc (=fo/N) of the comparison signal. When the frequency fc of the comparison signal is equal to the frequency fr (=fp/M) of the reference signal, that is, when fc=fr=1 kHz in the case where M=27000 and N=18432, the output voltage Vc (control voltage Vctl) is equal to the voltage Vs.

In FIG. 5, a voltage Vmax and a voltage Vmin are a maximum value and a minimum value, respectively, of the output voltage Vc (control voltage Vctl), and a voltage Vth and a voltage Vtl are the threshold voltage Vth on the high-voltage side and the threshold voltage Vtl on the low-voltage side, respectively, shown in FIG. 3.

When there is a change from this state such that the audio sampling frequency fs is changed to 44.1 kHz and the frequency dividing ratios M and N are changed to M=30000 and N=18816 as shown in Case 2 in FIG. 6, the frequency fr of the reference signal from the frequency divider 41 becomes 900 Hz, while the VCO 31 remains active to oscillate at 18.432 MHz, which is 384 times 48 kHz. The clock of 18.432 MHz is supplied as the output clock of the oscillating unit 30 to the frequency divider 42. Thus, the frequency fc of the comparison signal from the frequency divider 42 becomes 18.432 MHz/18816=980 Hz.

Consequently, the control voltage Vctl as the output of the loop filter 44 is decreased in accordance with the characteristics of FIG. 5 so as to bring the frequency fc of the comparison signal close to 900 Hz and bring the oscillation frequency of the VCO 31 close to 16.9344 MHz, which is 18816 times 900 Hz. Because of the narrow oscillation frequency range of the VCO 31, however, the oscillation frequency of the VCO 31 is not lowered to 16.9344 MHz. The control voltage Vctl (the output voltage Vc of the low-pass filter 51) is stuck to the minimum value Vmin, which is lower than the threshold voltage Vtl on the low-voltage side.

Thus, the output signal C2 of the comparator 54 in the VCO control unit 50 in FIG. 3 is changed from a high level to a low level to reset the RS flip-flop 55. The control signal S1 as one output of the RS flip-flop 55 is changed from active (high level) to inactive (low level), and the control signal S2 as the other output of the RS flip-flop 55 is changed from inactive (low level) to active (high level).

Thereby, the VCO 31 becomes inactive and the VCO 32 becomes active, so that the output clock of the VCO 32 is extracted as the output clock of the oscillating unit 30. The frequency fc of the comparison signal from the frequency divider 42 becomes 900 Hz, which is equal to the frequency fr of the reference signal from the frequency divider 41. The VCO 32 is controlled so that the oscillation frequency of the VCO 32 becomes 16.9344 MHz. Thus, an audio clock of 16.9344 MHz is obtained as the output clock of the oscillating unit 30.

At this time, the output voltage Vc of the low-pass filter 51 of the VCO control unit 50 in the audio PLL 24, that is, the control voltage Vctl as the output of the loop filter 44, is in a state of being locked and stabilized around a voltage Vs in FIG. 5.

When there is a change from this state such that the audio sampling frequency fs is changed to 48 kHz and the frequency dividing ratios M and N are changed to M=27000 and N=18432 as shown in Case 1 in FIG. 6, the frequency fr of the reference signal from the frequency divider 41 becomes 1 kHz, while the VCO 32 remains active to oscillate at 16.9344 MHz, which is 384 times 44.1 kHz. The clock of 16.9344 MHz is supplied as the output clock of the oscillating unit 30 to the frequency divider 42. Thus, the frequency fc of the comparison signal from the frequency divider 42 becomes 16.9344 MHz/18432=919 Hz.

Consequently, the control voltage Vctl as the output of the loop filter 44 is increased in accordance with the characteristics of FIG. 5 so as to bring the frequency fc of the comparison signal close to 1 kHz and bring the oscillation frequency of the VCO 32 close to 18.432 MHz, which is 18432 times 1 kHz. Because of the narrow oscillation frequency range of the VCO 32, however, the oscillation frequency of the VCO 32 is not increased to 18.432 MHz. The control voltage Vctl (the output voltage Vc of the low-pass filter 51) is stuck to the maximum value Vmax, which is higher than the threshold voltage Vth on the high-voltage side.

Thus, the output signal C1 of the comparator 53 in the VCO control unit 50 in FIG. 3 is changed from a high level to a low level to set the RS flip-flop 55. The control signal S1 as one output of the RS flip-flop 55 is changed from inactive (low level) to active (high level), and the control signal S2 as the other output of the RS flip-flop 55 is changed from active (high level) to inactive (low level).

Thereby, the VCO 31 becomes active and the VCO 32 becomes inactive, so that the output clock of the VCO 31 is extracted as the output clock of the oscillating unit 30. The frequency fc of the comparison signal from the frequency divider 42 becomes 1 kHz, which is equal to the frequency fr of the reference signal from the frequency divider 41. The VCO 31 is controlled so that the oscillation frequency of the VCO 31 becomes 18.432 MHz. Thus, an audio clock of 18.432 MHz is obtained as the output clock of the oscillating unit 30.

As described above, in the example of FIG. 2 and FIG. 3, even when information indicating the audio sampling frequency fs is not transmitted from the transmitting side to the receiving side as information for locking the audio PLL 24 on the receiving side, it is possible to change the oscillation frequency range of the VCO in the audio PLL 24 on the receiving side immediately and correctly in response to a change in the audio sampling frequency fs, and thus reliably reproduce the audio clock of the frequency fa corresponding to the audio sampling frequency fs.

SECOND EXAMPLE

FIG. 4

While the VCO control unit 50 in the example of FIG. 2 and FIG. 3 detects a change in the audio sampling frequency fs from the control voltage Vctl as the output of the loop filter 44, that is, the error signal as the output of the phase comparator 43, and changes the oscillation frequency range of the oscillating unit 30, the VCO control unit 50 may be configured to detect a change in the audio sampling frequency fs from the oscillation frequency of the oscillating unit 30, that is, the frequency fo of the output clock of the oscillating unit 30, and change the oscillation frequency range of the oscillating unit 30.

Figure 4:
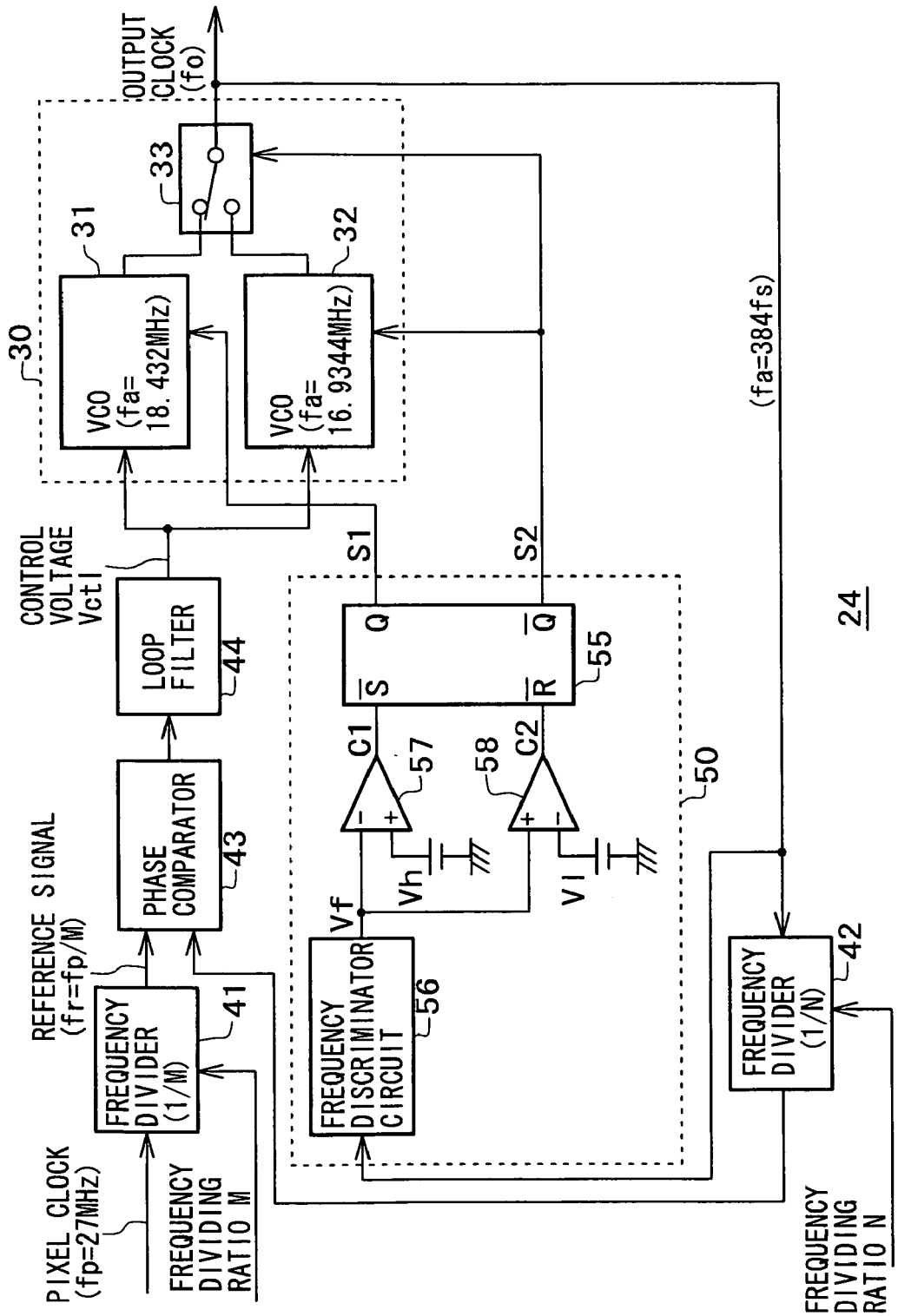
FIG. 4 is a diagram showing another example of an audio PLL on the receiving side.

FIG. 4 shows an example in this case. A VCO control unit 50 in this example comprises a frequency discriminator circuit 56, two comparators 57 and 58, and a state retaining RS flip-flop 55.

The frequency discriminator circuit 56 discriminates the frequency fo of the output clock of the oscillating unit 30. The frequency discriminator circuit 56 provides an output voltage Vf that linearly increases in value as the frequency fo is increased.

The comparators 57 and 58 compare the output voltage Vf of the frequency discriminator circuit 56 with a threshold voltage Vh on a high-voltage side and a threshold voltage Vl on a low-voltage side, respectively. Output signals C1 and C2 of the comparators 57 and 58 are supplied to a set side and a reset side, respectively, of the RS flip-flop 55.

The RS flip-flop 55 supplies one output signal S1 as a control signal to a VCO 31 and another output signal S2 as a control signal to a VCO 32.

The rest is the same as in the example of FIG. 2. As in the example of FIG. 3, a switching selector circuit 33 can be formed by two AND gates 35 and 36 and an OR gate 37.

In this example, when fs=48 kHz, M=27000, and N=18432 as shown in Case 1 in FIG. 6, detection and control of the VCO control unit 50 as described later makes the control signal S1 active (high level) and the control signal S2 inactive (low level), and thereby makes the VCO 31 active and the VCO 32 inactive.

Thus, at this time, the output clock of the VCO 31 is extracted as the output clock of the oscillating unit 30. Also, the frequency fc of a comparison signal from a frequency divider 42 becomes 1 kHz, which is equal to the frequency fr of a reference signal from a frequency divider 41. The VCO 31 is controlled so that the oscillation frequency of the VCO 31 becomes 18.432 MHz. Thus, an audio clock of 18.432 MHz is obtained as the output clock of the oscillating unit 30.

When there is a change from this state such that the audio sampling frequency fs is changed to 44.1 kHz and the frequency dividing ratios M and N are changed to M=30000 and N=18816 as shown in Case 2 in FIG. 6, the frequency fr of the reference signal from the frequency divider 41 becomes 900 Hz, while the VCO 31 remains active to oscillate at 18.432 MHz, which is 384 times 48 kHz. The clock of 18.432 MHz is supplied as the output clock of the oscillating unit 30 to the frequency divider 42. Thus, the frequency fc of the comparison signal from the frequency divider 42 becomes 18.432 MHz/18816=980 Hz.

Consequently, a control voltage Vctl as the output of a loop filter 44 is decreased in accordance with the characteristics of FIG. 5 so as to bring the frequency fc of the comparison signal close to 900 Hz and bring the oscillation frequency of the VCO 31 close to 16.9344 MHz, which is 18816 times 900 Hz. Because of the narrow oscillation frequency range of the VCO 31, however, the oscillation frequency of the VCO 31 is not lowered to 16.9344 MHz. The oscillation frequency of the VCO 31 becomes a frequency lower than 18.432 MHz but somewhat higher than 16.9344 MHz.

Thus, setting the threshold voltage Vl on the low-voltage side to a voltage value corresponding to a frequency somewhat higher than that frequency, the output voltage Vf of the frequency discriminator circuit 56 at this time becomes lower than the threshold voltage Vl. The output signal C2 of the comparator 58 is changed from a high level to a low level to reset the RS flip-flop 55. The control signal S1 as one output of the RS flip-flop 55 is changed from active (high level) to inactive (low level), and the control signal S2 as the other output of the RS flip-flop 55 is changed from inactive (low level) to active (high level).

Thereby, the VCO 31 becomes inactive and the VCO 32 becomes active, so that the output clock of the VCO 32 is extracted as the output clock of the oscillating unit 30. The frequency fc of the comparison signal from the frequency divider 42 becomes 900 Hz, which is equal to the frequency fr of the reference signal from the frequency divider 41. The VCO 32 is controlled so that the oscillation frequency of the VCO 32 becomes 16.9344 MHz. Thus, an audio clock of 16.9344 MHz is obtained as the output clock of the oscillating unit 30.

When there is a change from this state such that the audio sampling frequency fs is changed to 48 kHz and the frequency dividing ratios M and N are changed to M=27000 and N=18432 as shown in Case 1 in FIG. 6, the frequency fr of the reference signal from the frequency divider 41 becomes 1 kHz, while the VCO 32 remains active to oscillate at 16.9344 MHz, which is 384 times 44.1 kHz. The clock of 16.9344 MHz is supplied as the output clock of the oscillating unit 30 to the frequency divider 42. Thus, the frequency fc of the comparison signal from the frequency divider 42 becomes 16.9344 MHz/18432=919 Hz.

Consequently, the control voltage Vctl as the output of the loop filter 44 is increased in accordance with the characteristics of FIG. 5 so as to bring the frequency fc of the comparison signal close to 1 kHz and bring the oscillation frequency of the VCO 32 close to 18.432 MHz, which is 18432 times 1 kHz. Because of the narrow oscillation frequency range of the VCO 32, however, the oscillation frequency of the VCO 32 is not increased to 18.432 MHz. The oscillation frequency of the VCO 32 becomes a frequency higher than 16.9344 MHz but somewhat lower than 18.432 MHz.

Thus, setting the threshold voltage Vh on the high-voltage side to a voltage value corresponding to a frequency somewhat lower than that frequency, the output voltage Vf of the frequency discriminator circuit 56 at this time becomes higher than the threshold voltage Vh. The output signal C1 of the comparator 57 is changed from a high level to a low level to set the RS flip-flop 55. The control signal S1 as one output of the RS flip-flop 55 is changed from inactive (low level) to active (high level), and the control signal S2 as the other output of the RS flip-flop 55 is changed from active (high level) to inactive (low level).

Thereby, the VCO 31 becomes active and the VCO 32 becomes inactive, so that the output clock of the VCO 31 is extracted as the output clock of the oscillating unit 30. The frequency fc of the comparison signal from the frequency divider 42 becomes 1 kHz, which is equal to the frequency fr of the reference signal from the frequency divider 41. The VCO 31 is controlled so that the oscillation frequency of the VCO 31 becomes 18.432 MHz. Thus, an audio clock of 18.432 MHz is obtained as the output clock of the oscillating unit 30.

As described above, also in the example of FIG. 4, even when information indicating the audio sampling frequency fs is not transmitted from the transmitting side to the receiving side as information for locking the audio PLL 24 on the receiving side, it is possible to change the oscillation frequency range of the VCO in the audio PLL 24 on the receiving side immediately and correctly in response to a change in the audio sampling frequency fs, and thus reliably reproduce the audio clock of the frequency fa corresponding to the audio sampling frequency fs.

Other Embodiments

While in the foregoing embodiments, the audio sampling frequency fs is changed between two frequencies, the present invention can be applied to cases where the audio sampling frequency fs is changed between three frequencies or more by configuring the oscillating unit 30 and the VCO control unit 50 in a manner corresponding to the three or more frequencies.

In addition, while the pixel clock frequency fp in the foregoing embodiment is 27 MHz, the present invention is applicable to cases where the pixel clock frequency is other than 27 MHz, and cases where the pixel clock frequency is changed between a plurality of frequencies, for example 27 MHz and 74 MHz.

Further, while in the foregoing embodiment, video data and audio data are multiplexed for transmission, the present invention is applicable to cases where audio data and content data such as information data other than the audio data are multiplexed for transmission.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A digital transmission system, comprising:
a transmitting side operable to multiplex audio data and content data other than the audio data, to add a reference clock for the content data and other information to the multiplexed data to form composite data, the other information representing a frequency dividing ratio between the reference clock and an audio clock of a frequency corresponding to an audio sampling frequency, and to transmit the composite data; and
a receiving side operable to receive the composite data, to process the content data based on the reference clock, to reproduce the audio clock from the reference clock and the other information using a phase locked loop circuit, and to process the audio data based on the reproduced audio clock;
wherein the phase locked loop circuit includes a control unit and an oscillating unit having a first voltage controlled oscillator and a second voltage controlled oscillator, the control unit being operable to detect a change in the audio sampling frequency from a signal obtained within the phase locked loop circuit, and to change an oscillation frequency range of the oscillating unit by selecting one of the first voltage controlled oscillator and the second voltage controlled oscillator when a change in the audio sampling frequency is detected, and wherein the phase locked loop circuit comprises a phase comparator coupled to a loop filter, and wherein the control unit comprises first and second comparators to compare an output of the loop filter with first and second thresholds to generate a control signal to select one of the first voltage controlled oscillator and the second voltage controlled oscillator.

2. A digital transmission system as claimed in claim 1, wherein the phase locked loop circuit further includes a phase comparator, and the control unit is operable to detect a change in the audio sampling frequency from an error signal output from the phase comparator.

3. A digital transmission system as claimed in claim 1, wherein the control unit detects a change in the audio sampling frequency from an oscillation frequency of the oscillating unit.

* * * * *